(12) United States Patent
Kirknes

(10) Patent No.: US 10,847,899 B2
(45) Date of Patent: Nov. 24, 2020

(54) TRANSPONDER STABILIZATION

(71) Applicant: Norbit ITS, Trondheim (NO)

(72) Inventor: Steffen Kirknes, Ranheim (NO)

(73) Assignee: Norbit ITS, Trondheim (NO)

( * ) Notice: Subject to any disclaimer, the term of this patent is extended or adjusted under 35 U.S.C. 154(b) by 0 days.

(21) Appl. No.: 16/479,318

(22) PCT Filed: Jan. 24, 2018

(86) PCT No.: PCT/EP2018/051655
§ 371 (c)(1),
(2) Date: Jul. 19, 2019

(87) PCT Pub. No.: WO2018/138115
PCT Pub. Date: Aug. 2, 2018

(65) Prior Publication Data
US 2019/0356059 A1    Nov. 21, 2019

(30) Foreign Application Priority Data

Jan. 25, 2017  (NO) .................................... 20170109

(51) Int. Cl.
*H04B 1/04* (2006.01)
*H01Q 21/24* (2006.01)
(Continued)

(52) U.S. Cl.
CPC ............... *H01Q 21/24* (2013.01); *H01Q 1/38* (2013.01); *H01Q 3/46* (2013.01); *H01Q 9/0407* (2013.01);
(Continued)

(58) Field of Classification Search
CPC ........ H04B 1/0458; H04B 1/18; H01Q 21/24; H01P 5/12; H01P 5/16; H01P 5/19;
(Continued)

(56) References Cited

U.S. PATENT DOCUMENTS

| 3,267,462 A | 8/1966 | Gabriel |
| 3,371,284 A | 2/1968 | Engelbrecht |

(Continued)

FOREIGN PATENT DOCUMENTS

| EP | 2439702 A1 | 4/2012 |
| WO | WO-2005/060043 A2 | 6/2005 |

OTHER PUBLICATIONS

Cantú, H.I., et al.; "A 21 GHZ Reflection Amplifier MMIC for Retro-Directive Antenna and RFID Applications"; IET Seminar on MM-Wave Products and Technologies, vol. 2006; Jan. 2006; pp. 66-70.

(Continued)

*Primary Examiner* — Jason Crawford
(74) *Attorney, Agent, or Firm* — Shackelford, Bowen, McKinley & Norton, LLP

(57) ABSTRACT

Present invention is an antenna system and a wireless device comprising a negative resistance amplifier, the antenna system further comprises a first antenna element, said first antenna element being adapted to receive an incident wave for generating a first signal proportional to the incident wave, wherein the antenna system comprises a signal generating device for generating a second signal that is essentially 90 degrees phase shifted to the first signal, the first signal and the second signal being adapted to be applied to a hybrid coupler such that the first signal and the second signal are adapted to essentially destructively combine at a first hybrid coupler port, and the first signal and the second signal are adapted to be essentially constructively combined at a second hybrid coupler port, the second hybrid coupler port being adapted to operatively connect to the negative resistance amplifier, and the first hybrid coupler port being adapted to connect to a termination unit. Please invention is also a method for reflection of an incident wave.

8 Claims, 1 Drawing Sheet

(51) Int. Cl.
  *H01Q 1/38*   (2006.01)
  *H01Q 3/46*   (2006.01)
  *H01Q 9/04*   (2006.01)
  *H03F 1/32*   (2006.01)
  *H03F 1/34*   (2006.01)
  *H03F 3/60*   (2006.01)
  *H01P 5/22*   (2006.01)

(52) U.S. Cl.
  CPC ............... *H03F 1/32* (2013.01); *H03F 1/34* (2013.01); *H03F 3/608* (2013.01); *H04B 1/04* (2013.01); *H01P 5/227* (2013.01)

(58) Field of Classification Search
  CPC ... H01P 5/22; H01P 5/227; H03F 1/32; H03F 1/34; H03F 1/345
  See application file for complete search history.

(56) References Cited

U.S. PATENT DOCUMENTS

| | | |
|---|---|---|
| 3,633,109 A | 1/1972 | Schulz |
| 3,952,262 A | 4/1976 | Jamison |
| 4,684,952 A | 8/1987 | Munson et al. |
| 6,388,620 B1 | 5/2002 | Bhattacharyya |
| 6,895,226 B1 | 5/2005 | Forster et al. |
| 8,761,694 B2 * | 6/2014 | Lorenz ............... H04B 7/0874 455/103 |
| 2004/0110469 A1 * | 6/2004 | Judd ............... G01S 19/25 455/15 |
| 2009/0274072 A1 * | 11/2009 | Knox ............... H01Q 1/24 370/278 |
| 2009/0284082 A1 | 11/2009 | Mohammadian |
| 2010/0248651 A1 * | 9/2010 | Dent ............... H01Q 1/246 455/78 |

OTHER PUBLICATIONS

Landsberg, Naftali, et al.; "An F-Band Reflection Amplifier using 28 nm CMOS FD-SOI Technology for Active Reflectarrays and Spatial Power Combining Applications"; 2016 IEEE MTT-S International Microwave Symposium (IMS), IEEE; May 2016; 3 pages.
Sípal, Vít, "International Search Report" for PCT/EP2018/051655, dated Apr. 20, 2018, pp. 1-4.

* cited by examiner

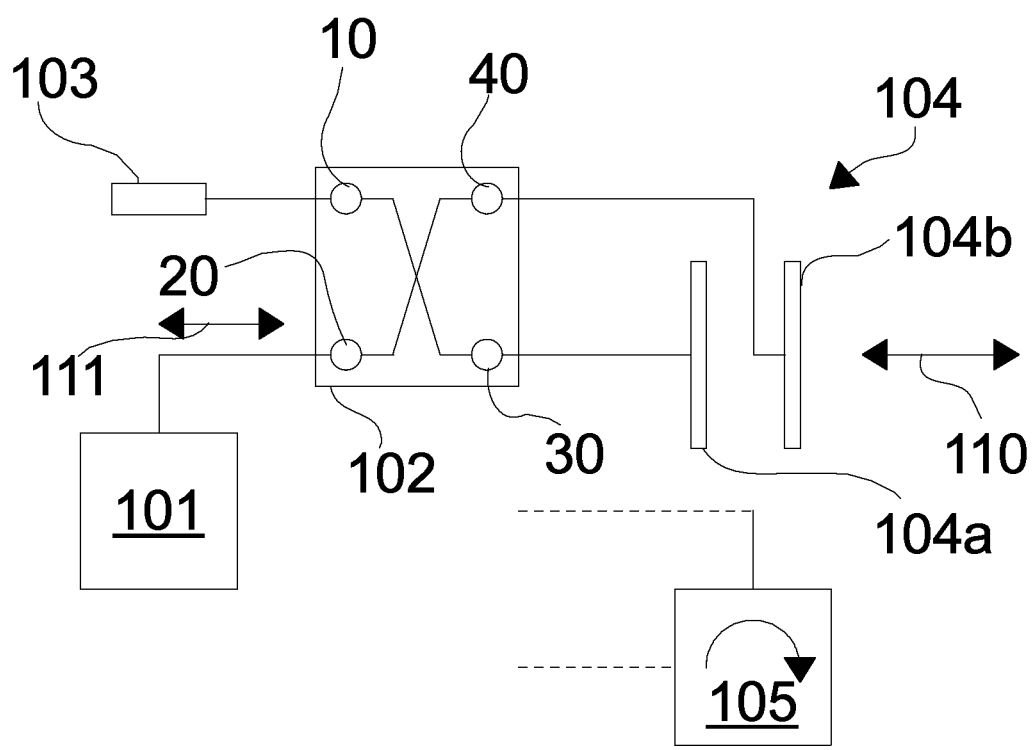

TRANSPONDER STABILIZATION

The present teachings generally relate to negative impedance amplifiers. More specifically, the present teachings relate to an amplifier with negative impedance, said amplifier being operatively coupled to a narrow bandwidth antenna, and a method for operation thereof.

Negative resistance amplifiers are known as such, for example, U.S. Pat. No. 3,633,109 teaches a negative resistance antenna amplifier arrangement. In US2009/0284082A1 a method and apparatus with negative resistance in wireless power transfers is taught.

In wireless systems, requirements such as impedance matching, gain flatness, and stability are typically important.

U.S. Pat. No. 3,371,284 taught a balanced four-terminal amplifier that utilizes a pair of matches amplifying devices and input and output couplers for improved impedance matching, and to eliminate the need for tuning and adjustments.

In wireless systems using negative resistance amplifier, gain is achieved when the reflection coefficient of the antenna and the negative resistance amplifier becomes more than unity.

As in closed loop systems as known from the control system theory, there must be a sufficient gain and/or a phase margin to ensure stability. The requirements for phase and gain margin for stability of the system may be hard to meet without scarifying the gain.

When an antenna with a relatively narrow bandwidth is connected to a negative resistance amplifier, these margins may become hard to achieve. This is especially relevant in practical cases where the impedance of the antenna will normally change due to its environment and other external factors. Aging of various components may be yet another factor that changes the parameters of the system over time.

At least some of the above-mentioned and other problems inherent to the prior art will be shown solved by the features of the accompanying independent claims.

This present teachings relate to a device and a method for maintaining stability in at least most of the conditions mentioned above. More specifically, the present teachings relate to a device and method for maintaining stability in negative resistance amplifier based wireless systems.

According to an aspect of the present teachings can provide an antenna system for enabling the use of negative resistance amplifiers with antennas especially of narrow bandwidth as for example, resonant antennas, preferably for use in transponder applications.

According to an aspect of the present teachings, the antenna system or arrangement is provided by coupling two similar antennas to a hybrid that is further connected to a negative resistance element.

According to a further aspect, a method for reflecting an incident wave can be provided.

According to another aspect, a wireless device comprising the antenna system can also be provided.

The present teachings will now be discussed more in detail using the following drawings illustrating the embodiments of the present teachings by way of non-limiting examples.

FIG. 1 illustrates an antenna arrangement according to the present teachings.

FIG. 1 shows an embodiment of the antenna arrangement according to the present teachings. Two identical antenna elements 104a and 104b are connected to a hybrid coupler 102. The two antennas or antenna pair 104 has a first antenna 104a and a second antenna 104b. The first and the second antenna 104a and b are preferably identical. The hybrid coupler 102 has four ports, that are a first port 10, a second port 20, a third port 30 and a fourth port 40 respectively. The first antenna 104a is connected to the third port 30, whereas the second antenna 104b is connected to the fourth port 40 of the hybrid 102. The first port of the hybrid is connected to a termination unit 103 or more simply called, a terminating impedance. A person skilled in the art will appreciate that the terminating impedance or terminating resistor more simply called a termination 103 is often 50 ohms, but it can also be of any other value as per requirements. The termination unit 103 may alternatively be an active termination network. The hybrid coupler 102 is a 90-degree coupler arranged such that when a second input signal applied at port 40 is 90 degrees phase shifted with respect to a first input signal applied at port 30, a first output signal or output at the first port 10 will essentially be a destructive combination of the first input signal and the second input signal, whereas a second output signal or output at the second port 20 will be a constructive combination of the first input signal and the second input signal. By constructive combination it is meant that the resulting signal, at the second port 20, will be related to the sum of the first input signal and the second input signal. By destructive combination it is meant that the resulting signal, at the first port 10, will be related to a subtraction or difference of the first input signal and the second input signal. Although in theory the destructive combination will result in zero signal at the first port 10, a person skilled in the art will understand that the destructive combination will in practice be at least substantial. Any residual signal at the first port due to imperfect destructive combination will be absorbed at least substantially by the termination unit 103.

The FIGURE further shows a negative resistance amplifier 101 connected to the second port 20 of the hybrid 102. In addition, a patch antenna 105 with orthogonal feed is shown as an alternative, that can be connected at ports 30 and 40 instead of the antenna pair 104.

The two antennas 104 are configured to receive an incident wave 110 with a phase shift of around or exactly 90 degrees. This is for example, a common configuration for orthogonal antennas receiving a circular polarized wave, but the present teachings can also be applied to other configurations. It will further be appreciated that according to one aspect when the antenna elements 104a and 104b are arranged to receive the same incident wave 110, the resulting first input signal and the second input signal will have essentially the same amplitude, but will be around or exactly 90 degrees phase shifted with respect to each another.

The received signals, or the first input signal and the second input signal, captured by the antennas are combined in the hybrid 120 that is shown here in the form of a 90-degree coupler. The combined signals 111 appear at the port 20 connected to the negative resistance amplifier or element 101. Alternatively, the received signals can also be combined with a 0 degree coupler, instead of the 90 degrees coupler 102, when 90 degrees phase shift is performed separately or externally.

The negative resistive element 101 after receiving the signal 111 will amplify and output the amplified signal that travels through the same port 20 and signal path, but in the opposite direction through the hybrid 120 and to the antennas 104 to retransmit an amplified wave that is transmitted back or reflected by the antennas 104 towards the source that sent the incident wave. The transmitted wave is related to the incident wave combined with the transfer function of the system, i.e., including the gain of the amplifier 101 and the hybrid 102, etc.

In practical cases, due to non-idealities in the system, such as mismatch in the antenna impedances, a part of the energy sent from the negative resistance element 101 is reflected back from the two antennas 104 having a similar reflection coefficient, back to towards the hybrid 102. As this reflected signal will travel twice through the 90 degree phase-shifted path of the hybrid, it will be substantially canceled at the port 20 of the negative resistance amplifier 101 and will instead appear at the termination 103 at the first port 10 of the hybrid 120, where the signal will be absorbed. The process of canceling of the signal is similar to the constructive and destructive combination of signals as was explained in context of the signals due to incident wave 110. For these non-ideal signals that pass through the hybrid twice, a constructive combination happens at the first port 10, whereas a destructive combination happens at the second port 20. As a result, the non-ideal signals are at least substantially absorbed by the termination unit 103. For the constructive and destructive combination to work properly, it is preferable that electrical characteristics of the first antenna element 104a are similar to those of the second antenna element 104b. This is for both the antenna elements to have a similar behavior such that the destructive combination results in a minimal amount of non-desired signal at the amplifier side or the second port 20.

A person skilled in the art will appreciate that even though the examples discussed herein show two antenna elements 104a and 104b, it can still be possible to apply the present teachings without undue burden by having just one antenna element for receiving the incident wave and transmitting the reflecting wave (for example only the first antenna element 104a being connected to the third port 30), whereas connecting the other port (e.g., the fourth port 40) to a signal generating device instead of another antenna element, as long as the signal generating device generates a signal at the port of the hybrid where it is connected such that the generated signal is essentially 90 degrees phase shifted as compared to the signal generated by the now single antenna element connected to the hybrid. It is further desirable for the signal generating device to have electrical characteristics similar to that of the single antenna element for the cancellation of the non-ideal signals at the second port 20 to be at least substantial.

According to the present teachings, the negative resistance element 101 is thus exposed to a more wideband and constant impedance of the terminated hybrid circuit, rather than the varying antenna impedance, which has advantages such as allowing for exploiting higher gain values, as compared to the conventional systems, while maintaining the stability requirements.

Narrowband antennas, such as resonant antennas, have narrow bandwidth such that phase varies a lot over the operational range. This creates problems for achieving stability in the amplifier. According to the present teachings, by introducing the hybrid 102 between the antenna and the amplifier 101, the impedance as seen from the negative resistance amplifier 101 side becomes essentially constant over the bandwidth of the hybrid 102. The bandwidth of the hybrid 102 may for example be 50% compared to a few percent of that of a patch antenna, which makes achieving a stable operation of the negative resistance amplifier substantially easier. According to the proposed arrangement, the impedance seen by the amplifier 101 at port 20 will be essentially the value of the terminating impedance 103, instead of the impedance of the antenna 104.

According to another embodiment, the two antennas 104 may for example be parallel dipoles that are spaced by a quarter of a wavelength. The signals from the amplifier will then radiate in the plane of the dipoles, to the side of the dipole fed with the lagging phase.

Any signals received from the same direction will be fed to the negative resistance amplifier. In this case the 90 degree phase shift is used to achieve better directivity.

Alternatively, the antennas 104 can be two crossed dipoles where the 90 degree phase shift enables the system to receive and transmit a circular polarized field perpendicular to the dipoles.

Alternatively, two dipoles 104a, 104b may be substituted by a patch 105 with an orthogonal feed.

The two similar antennas are located such as to receive the incident wave at a phase difference of 90 degree. This is typical, for example for orthogonal antennas receiving a circular polarised wave. According to another aspect, the two similar antennas may be in the form of an orthogonally fed circular antenna. A skilled person will understand that all antenna arrangements capable of generating two output signals essentially 90 degrees apart lie within the ambit of the present teachings.

Depending on the frequency, the antennas having essentially equal impedance will reflect the signals similarly. As the antennas have a similar impedance, the reflected signals becomes 90 degree shifted due to the coupler and get substantially canceled at the amplifier side, or port 20.

To summarize, the present teachings relate to an antenna system or arrangement comprising a negative resistance amplifier. The antenna system further comprises a first antenna element. The first antenna element is configured to receive an incident wave for generating a first signal relative or proportional to the incident wave. The antenna system also comprises a signal generating device for generating a second signal. The second signal is essentially 90 degrees phase shifted as compared to the first signal. The first signal and the second signal are configured to be applied to a hybrid coupler such that the first signal and the second signal essentially destructively combine to a first output signal at a first hybrid coupler port, and the first signal and the second signal essentially constructively combine to a second output signal at a second hybrid coupler port. By saying, the first signal and the second signal essentially destructively combine at a first hybrid coupler port, it is meant that the first output signal at the first hybrid port is proportional to a destructive combination of the first signal and the second signal. The first hybrid coupler port and the second hybrid coupler port are ports of the hybrid coupler. By saying, the first signal and the second signal essentially constructively combine at a second hybrid coupler port, it is meant that the second output signal at the second hybrid port is proportional to a constructive combination of the first signal and the second signal. The second hybrid coupler port is adapted to operatively connect to the negative resistance amplifier for amplifying the second output signal. The first hybrid coupler port is adapted to connect to a termination unit for at least substantially absorbing the first output signal. A skilled person will appreciate that the first signal and the second signal are electrical signals, at least one of them generated by an incident electromagnetic wave captured by the antenna arrangement.

A person skilled in the art will understand that when the first signal is equal to the second signal in terms of amplitude, provided they are 90 degrees phase shifted with respect to each other as explained earlier, the destructive combination, i.e., the first output signal, at the first hybrid port or the first port 10 will in theory be a zero resultant signal. In practice, for example, due to non-ideal components, this destructive combination at the first port 10 will be a residual signal, but it will be absorbed or dissipated at least substantially in the termination unit 103. Moreover, the amplitudes of the received first signal and the second signal may not always be equal, which will also result in a residual signal at the first port 10 to be non-zero, which will also be at least substantially absorbed by the termination unit 103. Skilled person will however note that the amplified signal generated by the amplifier 101 at port 20 will split essentially equally in the hybrid 102 to be outputted between the third and fourth port, 30 and 40, respectively. Any signals reflected by the similar antenna elements 104a and 104b, as explained previously, will thus also be substantially equal. These unwanted signals that are reflected by the antenna elements 104a and 104b, and any other similar common-mode signals will undergo substantial reduction by destructive combination at the second port 20 when they travel back through the hybrid 102 towards the amplifier 101 after being reflected by the antenna elements 104a and 104b. As explained earlier, 104a and 104b need not both be antenna elements. A skilled person will further appreciate that any other common-mode signals occurring at the third and the fourth port 30 and 40 will also undergo similar cancellation at the amplifier input or the second port 20. An example of such other common-mode signals is any other signals that are received by the first antenna element 104a and the second antenna element 104b with essentially similar phase with respect to each other. This is another advantage of the present teachings as the common-mode signals at amplifier input can be reduced, thus for example, also resulting in better utilization of the dynamic range of the amplifier 101.

In a further aspect, the signal generating device is a second antenna element arranged to receive the incident wave at essentially 90 degrees difference with respect to the first antenna element.

According to another aspect, the negative resistance amplifier is further configured to output an amplified signal at the second hybrid coupler port. The amplified signal at least partially comprises an amplified second output signal. Accordingly, the antenna arrangement can be used for reflecting an amplified incident wave. As it will be appreciated, the incident wave is first received by at least one of the antenna elements of the antenna arrangement and then constructively recombined at the second hybrid port. An amplifier, commonly a negative resistance amplifier, coupled at the second hybrid port can thus receive the constructive recombination or the second output signal and amplify the same with a predetermined amplifier gain to generate an amplified second output signal. The second output signal then propagates towards the third and fourth hybrid ports and is reflected by the at least one of the antenna elements.

In another embodiment, the difference in amplitude between the first signal and the second signal may be viewed as an independent "error" signal which is phase shifted the opposite way and thus appears at the first hybrid port. This may for, example be used for calibrating the position of the antenna. Accordingly, the antenna system can also comprise a computational unit configured to compare a difference in amplitude between the first input signal and the second input signal to generate an error signal. The error signal can be used by the computational unit for calculating or calibrating a position of the antenna arrangement. The computational unit may comprise a termination or an active termination unit coupled to the first hybrid port.

In yet another embodiment, the first antenna element and the second antenna element are arranged in the form of an orthogonal type antenna or, according to another aspect, an orthogonally fed circular antenna. In other words, instead of an antenna element and a signal generating device, or two similar antenna elements, an orthogonal type antenna is connected between the third port and the fourth port of the hybrid.

The present teachings also relate to a method for reflection of an incident wave comprising the steps of:

Generating a first input signal at a third port of a hybrid coupler by receiving the incident wave using a first antenna Generating a second input signal at a fourth port of the hybrid coupler, the second signal being essentially 90 degrees shifted with respect to the first signal Inputting the first input signal and the second input signal to the hybrid coupler thereby generating a first output signal at a first port of the hybrid coupler, said first output signal being a destructive combination of the first input signal and the second input signal; and generating a second output signal at a second port of the hybrid coupler, said second output signal being a constructive combination of the first input signal and the second input signal Absorbing at least substantially the first output signal using a termination unit connected at the first output port Amplifying the second output signal using the negative resistance amplifier for generating an amplified signal, and then feeding the amplified signal to the second port of the hybrid for generating a first transmitted signal at the third port of the hybrid Reflecting a first reflected wave proportional to the first transmitted signal using the first antenna element Receiving any non-desired signals, generated due to non-idealities such as mismatch, at the first port and absorbing at least substantially said non-desired signals using the termination unit.

In another embodiment, the second signal is generated by a second antenna element, and the method also comprises the steps:

Generating a second transmitted signal at the fourth port of the hybrid relative to the amplified signal Reflecting a second reflected wave proportional to the second transmitted signal using the second antenna element, said second reflected wave being essentially 90 degrees phase shifted relative to the first reflected wave As discussed previously, the first antenna element and the second antenna elements can be a same antenna unit, for example, an orthogonal type antenna.

The present teachings further relate to a wireless device comprising the antenna system and/or implementing the method steps according to any aspects of the present teachings as discussed herein. The wireless device is preferably a transponder.

A skilled person will appreciate that the various aspects and embodiments of the present teachings disclosed herein may be freely combined. The various aspects and embodiments are hence linked and any combination of the teachings are embodiments lies within the ambit of this disclosure.

The invention claimed is:

1. An antenna system comprising:
    a negative resistance amplifier;
    a first antenna element, said first antenna element being configured to receive an incident wave for generating a first signal proportional to the incident wave;
    a signal generating device for generating a second signal that is essentially 90 degrees phase shifted to the first signal, the first signal and the second signal being configured to be applied to a hybrid coupler such that the first signal and the second signal are configured to essentially destructively combine to a first output signal at a first hybrid coupler port;
    wherein the first signal and the second signal are configured to be essentially constructively combined to a second output signal at a second hybrid coupler port; and
    wherein the second hybrid coupler port is configured to operatively connect to the negative resistance amplifier for amplifying the second output signal, and the first hybrid coupler port being configured to connect to a termination unit for at least substantially absorbing the first output signal.

2. The antenna system according to claim 1, wherein the signal generating device is a second antenna element arranged to receive the incident wave at essentially 90 degrees difference with respect to the first antenna element.

3. The antenna system according to claim 2, wherein the first antenna element and the second antenna element are arranged in the form of an orthogonal type antenna or an orthogonally fed circular antenna.

4. The antenna system according to claim 2, comprising a computational unit configured to compare a difference in amplitude between the first input signal and the second input signal to generate an error signal, the error signal being used by the computational unit for calculating or calibrating a position of the antenna arrangement.

5. The antenna system according to claim 1, wherein the negative resistance amplifier is further configured to output an amplified signal at the second hybrid coupler port, the amplified signal being an amplified second output signal.

6. A wireless device comprising the antenna system according to claim 1.

7. A method for reflection of an incident wave, the method comprising:
    generating a first input signal at a third port of a hybrid coupler by receiving the incident wave using a first antenna;
    generating a second input signal at a fourth port of the hybrid coupler, the second signal being essentially 90 degrees shifted with respect to the first signal;
    inputting the first input signal and the second input signal to the hybrid coupler thereby generating a first output signal at a first port of the hybrid coupler, said first output signal being a destructive combination of the first input signal and the second input signal; and
    generating a second output signal at a second port of the hybrid coupler, said second output signal being a constructive combination of the first input signal and the second input signal;
    absorbing at least substantially the first output signal using a termination unit connected at the first output port;
    amplifying the second output signal using the negative resistance amplifier for generating an amplified signal, and then feeding the amplified signal to the second port of the hybrid for generating a first transmitted signal at the third port of the hybrid;
    reflecting a first reflected wave proportional to the first transmitted signal using the first antenna element; and
    receiving any non-desired signals, generated due to non-idealities such as mismatch, at the first port and absorbing at least substantially said non-desired signals using the termination unit.

8. The method according to claim 7, wherein the second signal is generated by a second antenna element, and the method also comprises the steps:
    generating a second transmitted signal at the fourth port of the hybrid relative to the amplified signal;
    reflecting a second reflected wave proportional to the second transmitted signal using the second antenna element, said second reflected wave being essentially 90 degrees phase shifted relative to the first reflected wave.

* * * * *